United States Patent
Kudoh et al.

(10) Patent No.: US 10,516,844 B2
(45) Date of Patent: Dec. 24, 2019

(54) IMAGE CAPTURING DEVICE AND IMAGE CAPTURING METHOD

(71) Applicant: Ricoh Company, Ltd., Tokyo (JP)

(72) Inventors: Yuusuke Kudoh, Saitama (JP); Tohru Kanno, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 10 days.

(21) Appl. No.: 16/018,629

(22) Filed: Jun. 26, 2018

(65) Prior Publication Data
US 2018/0376095 A1 Dec. 27, 2018

(30) Foreign Application Priority Data
Jun. 27, 2017 (JP) .................................. 2017-125516

(51) Int. Cl.
| | |
|---|---|
| *H04N 5/376* | (2011.01) |
| *H04N 5/369* | (2011.01) |
| *H04N 5/341* | (2011.01) |
| *H01L 27/146* | (2006.01) |
| *H04N 5/374* | (2011.01) |
| *H04N 5/225* | (2006.01) |

(52) U.S. Cl.
CPC ..... *H04N 5/3765* (2013.01); *H01L 27/14609* (2013.01); *H04N 5/2253* (2013.01); *H04N 5/3741* (2013.01)

(58) Field of Classification Search
CPC . H04N 5/3692; H04N 5/341; H01L 27/14609
See application file for complete search history.

(56) References Cited

U.S. PATENT DOCUMENTS

| | | | | |
|---|---|---|---|---|
| 2006/0146161 A1* | 7/2006 | Farrier | .............. | H01L 27/14603 348/308 |
| 2013/0221199 A1* | 8/2013 | Kato | .................... | H04N 5/3692 250/208.1 |

FOREIGN PATENT DOCUMENTS

| | | |
|---|---|---|
| JP | 2012-248953 | 12/2012 |
| JP | 2015-106908 | 6/2015 |
| JP | 201 5-159463 | 9/2015 |
| JP | 2016-208351 | 12/2016 |

* cited by examiner

*Primary Examiner* — Christopher K Peterson
(74) *Attorney, Agent, or Firm* — Xsensus LLP

(57) ABSTRACT

An image capturing device includes a photoelectric converter including one of a plurality of pixels, an amplifier, and control circuitry. Each pixel includes at least a photoelectric conversion element, and is configured to output an electrical signal corresponding to an intensity of light received by the photoelectric conversion element. The control circuitry is configured to sequentially drive the plurality of pixels in a time staggered manner such that, during a time from when a certain pixel outputs a reset signal of the certain pixel to the amplifier to when the pixel outputs a signal of the certain pixel to the amplifier, a subsequent pixel of the certain pixel outputs one of a reset signal and a signal of the subsequent pixel to the amplifier. The reset signal represents an electrical signal of a reset voltage to reset a corresponding pixel. The signal represents the electrical signal.

12 Claims, 11 Drawing Sheets

IMAGE CAPTURING DEVICE AND IMAGE CAPTURING METHOD

CROSS-REFERENCE TO RELATED APPLICATION

This patent application is based on and claims priority pursuant to 35 U.S.C. § 119(a) to Japanese Patent Application No. 2017-125516, filed on Jun. 27, 2017 in the Japan Patent Office, the entire disclosure of which is hereby incorporated by reference herein.

BACKGROUND

Technical Field

Embodiments of the present disclosure relate to an image capturing device and an image capturing method.

Background Art

An image sensor, equipped with a plurality of photo sensors (or pixels), photoelectrically converts light striking each pixel into a signal representing the intensity of the light, and outputs the signal. The image sensor further amplifies the output signal and performs, for example, analog-to-digital (A/D) conversion on the amplified signal.

A line sensor, which is often used in copiers, includes approximately several thousand to several hundred thousand pixels. In such a line sensor, if each pixel is provided with a circuit (an amplifier), the number of circuits increases, resulting in an increase in area of the circuits and consumption current.

To avoid such a situation, a technology using exclusive control is known in which an amplifier is shared by a plurality of pixels and operated by switching the pixels to be selected to use the amplifier, which reduces the number of amplifiers. Further, in such a technology, no current is supplied to unused pixels while switching among pixels, which reduces the consumption current.

Further, a correlated double sampling (CDS) method is typically used in reading a signal (an electrical signal) from a pixel that outputs a signal corresponding to the intensity of light received by the pixel as a signal level based on the reset level. However, due to the characteristics of the pixel it takes a certain amount of time to read out the signal after reading out the reset signal, and there is now a demand for the image sensors to read out the signals more rapidly.

SUMMARY

In one aspect of this disclosure, there is provided an improved image capturing device including a photoelectric converter including one of a plurality of pixels, an amplifier, and control circuitry. Each of the plurality of pixels includes at least a photoelectric conversion element, and is configured to output an electrical signal corresponding to an intensity of light received by the photoelectric conversion element. The amplifier is configured to amplify the electrical signal output by each of the plurality of pixels. The control circuitry is configured to sequentially drive the plurality of pixels in a time staggered manner such that, during a time period from when a certain pixel outputs a reset signal of the certain pixel to the amplifier to when the pixel outputs a signal of the certain pixel to the amplifier, a subsequent pixel of the certain pixel outputs one of a reset signal and a signal of the subsequent pixel to the amplifier. The reset signal represents an electrical signal of a reset voltage to reset a corresponding pixel. The signal represents the electrical signal corresponding to the intensity of light received by the photoelectric conversion element of the corresponding pixel.

In another aspect of this disclosure, there is provided an improved image capturing method including outputting an electrical signal corresponding to an intensity of light received by a photoelectric conversion element each included in each of a plurality of pixels; driving a certain pixel of the plurality of pixels, which is to be sequentially driven in a time staggered manner, to output a reset signal representing an electrical signal corresponding to a reset voltage to reset the certain pixel to an amplifier; and driving a subsequent pixel of the certain pixel to output one of a reset signal of the subsequent pixel and a signal representing an electrical signal corresponding to an intensity of light received by a photoelectric conversion element of the subsequent pixel before the certain pixel outputs a signal of the certain pixel, after the driving of the certain pixel to output the reset signal of the certain pixel.

BRIEF DESCRIPTION OF THE DRAWINGS

The aforementioned and other aspects, features, and advantages of the present disclosure will be better understood by reference to the following detailed description when considered in connection with the accompanying drawings, wherein.

Figure 1:
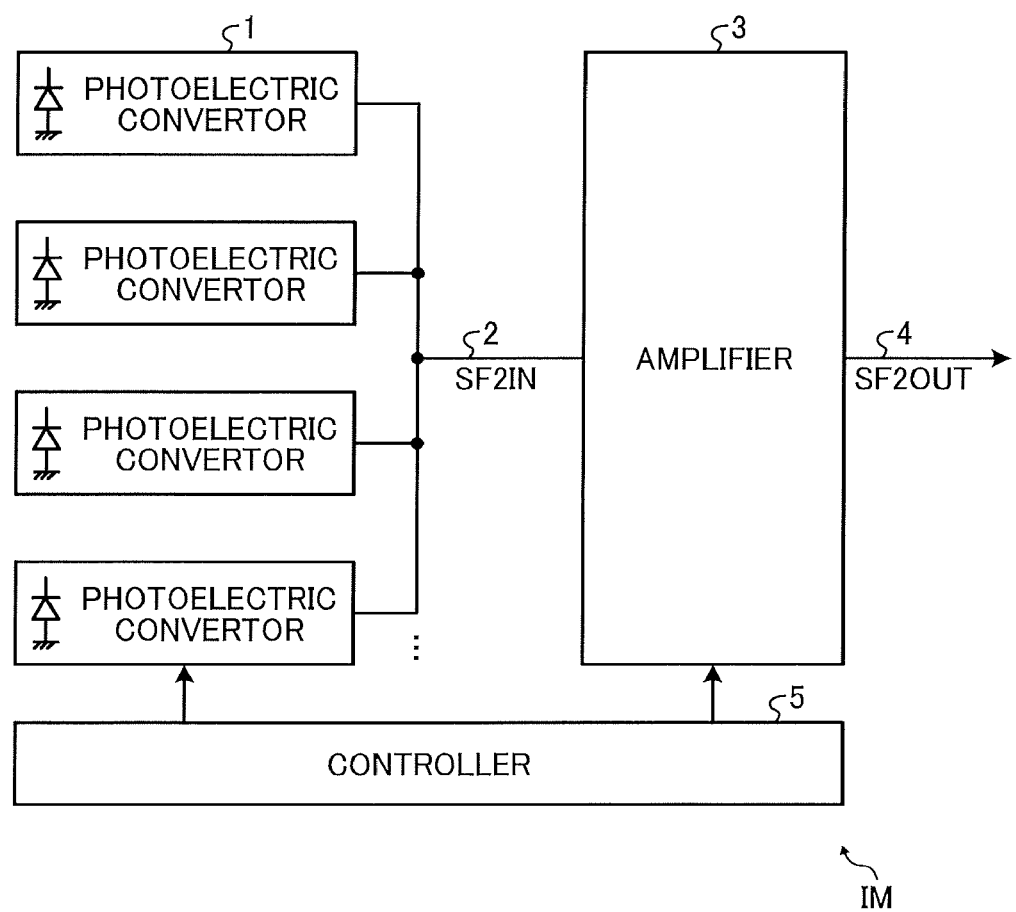
FIG. 1 is a schematic view of a part of an image sensor mounted on an image capturing device according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity.

However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

A description is given below of an image capturing device 1000 and an image capturing method according to at least one embodiment of the present disclosure, referring to the drawings.

FIG. 1 is a schematic view of a part of an image sensor IM mounted on the image capturing device 1000 according to an embodiment of the present disclosure.

The image sensor IM includes a plurality of photoelectric convertors 1 each including a photoelectric conversion element 12, which is to be described later with reference to FIG. 3, to receive light. Each photoelectric convertor 1 photoelectrically converts the light received by the photoelectric conversion element 12 into an analog signal (an electrical signal) SF2IN, and outputs the analog signal SF2IN to an output line 2 over a specified time. The output line 2 is connected to the input of an amplifier 3. The amplifier 3 amplifies the analog signal SF2IN transmitted from the photoelectric convertor 1 via the output line 2 and outputs the amplified analog signal SF2OUT to an output line 4. The operations of the photoelectric convertor 1 and the amplifier 3 are controlled by a controller 5 of the image sensor IM. The controller 5 is a central processing unit (CPU).

The photoelectric conversion elements 12 included in the photoelectric convertors 1 are typically small in size and therefore the amplifier 3 is usually provided to prevent deterioration in later-stage responsiveness. Accordingly, the amplifier 3 is disposed to buffer the output of the photoelectric convertor 1. The output line 2 is connected to the plurality of photoelectric convertors 1. The plurality of photoelectric convertors 1 shares the output line 2, which advantageously reduces the size of the chip. The number of photoelectric convertors 1 that share one amplifier 3 is variable with, for example, design conditions.

Figure 2:
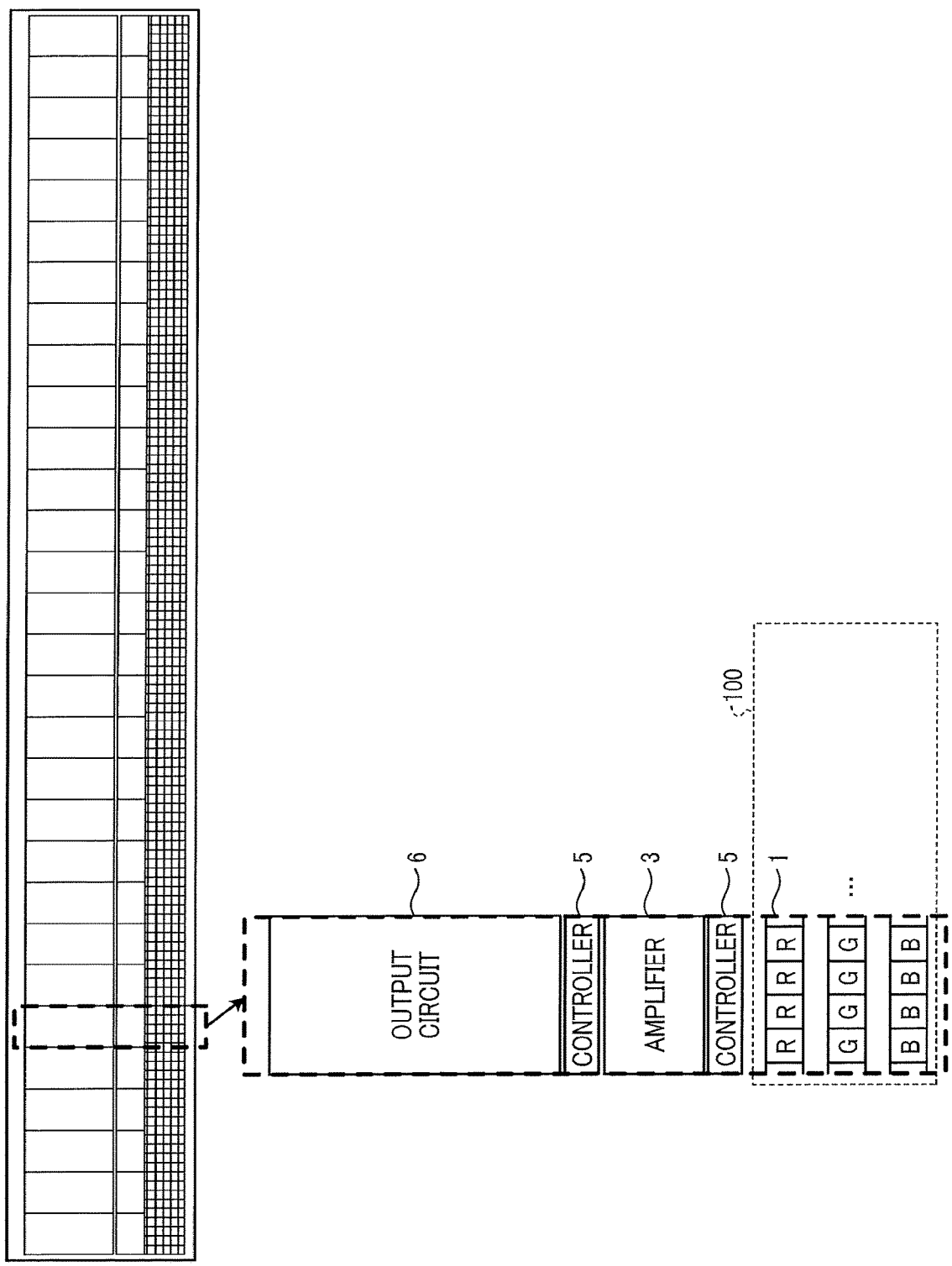
FIG. 2 is an example layout of the image sensor of FIG. 1.

FIG. 2 is an example layout of the image sensor IM mounted on the image capturing device 1000 according to an embodiment of the present disclosure.

The image sensor IM of FIG. 2 is an example of a line sensor. In FIG. 2, the image sensor IM includes a photoelectric conversion area 100 in which the photoelectric convertors 1 are arranged in two dimensions.

Specifically, the photoelectric conversion area 100 of the line sensor includes a plurality of photoelectric convertors 1 corresponding to at least three colors, red, green, and blue (RGB). For each color, thousands to tens of thousands of pixels are arranged in the horizontal direction of the drawing.

As described later, one photoelectric convertor 1 has a circuit configuration that includes one pixel.

As illustrated in FIG. 2, the image sensor IM includes an output circuit 6. The output circuit 6 includes a circuit to amplify the signal SF2OUT output from the amplifier 3 and another circuit to perform analog-to-digital (A/D) conversion on the signal SF2OUT.

In the following, a description is given of the plurality of photoelectric convertors 1 according to at least one embodiment of the present disclosure.

Figure 3:
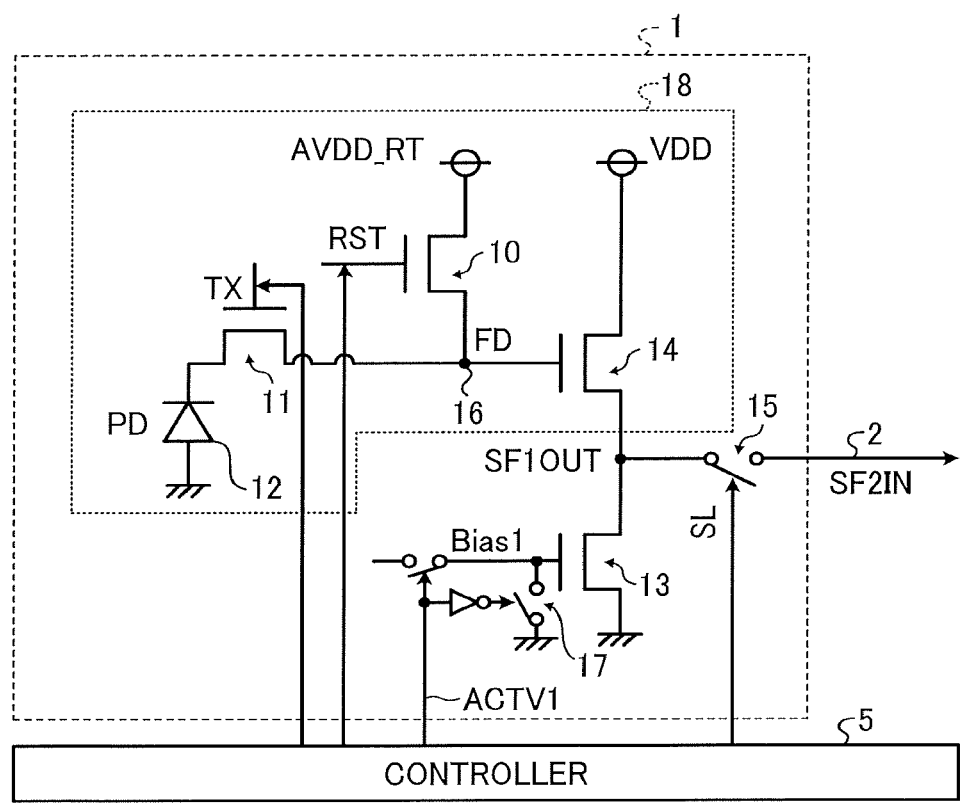
FIG. 3 is a circuit diagram of a photoelectric convertor according to an embodiment of the present disclosure.

FIG. 3 is a circuit diagram of one of the photoelectric convertors 1 according to an embodiment of the present disclosure. The other photoelectric convertors 1 have the same configuration as the configuration illustrated in FIG. 3. Note that in some examples, the circuit elements are arranged in a manner different from the manner in FIG. 3. the photoelectric convertor 1 includes, for example, one pixel 18.

As illustrated in FIG. 3, the pixel 18 includes a photoelectric conversion element 12, a transfer element 11, a floating diffusion (FD) 16, a source follower 14, and a reset element 10.

The photoelectric conversion element 12, which is, for example, a photodiode, receives light and generates an electrical signal corresponding to the intensity of the received light, outputting the signal.

The photoelectric conversion element 12 further generates a signal charge corresponding to the intensity of the received light, and holds and accumulates the generated signal charge therein.

The transfer element 11 transfers the electrical signal output from the photoelectric conversion element 12.

More specifically, the transfer element 11 is an example of a switching element, such as a metal oxide semiconductor field-effect transistor (MOSFET), disposed between the photoelectric conversion element 12 and the FD 16.

The controller 5 supplies a control signal (a voltage) TX to the gate of the transfer element 11 to control the transfer element 11 to switch on and off.

The FD 16 is an example of a "capacitive element", and holds the electrical signal transferred from the transfer element 11. In the present embodiment, the FD 16 is a stray capacitance.

The source follower 14 is an example of a transistor such as a MOSFET. The source follower 14 has a source terminal that outputs the electrical signal SF1OUT corresponding to the electrical signal output from the FD 16 to the gate of the source follower 14.

The source follower 14 has the gate connected to the FD 16, and has the drain terminal connected to the power line through which the source voltage VDD is supplied to the drain terminal.

The reset element 10 sets the voltage of the FD 16 to a reset voltage (a voltage to initialize the pixel 18).

The reset element 10 is a switching element disposed between the FD 16 and the power line through which a fixed voltage AVDD_RT, i.e., the reset voltage, is supplied to the reset element 10.

The controller 5 supplies a control signal RST to the gate of the reset element 10 to control the reset element 10 to switch on and off.

When on, the reset element 10 resets the FD 16 to the fixed voltage AVDD_RT reference level. When off, the reset element 10 sets the FD 16 to a floating state.

As illustrated in FIG. 3, the photoelectric convertor 1 further includes a source follower drive circuit 13, a control switch 17, and a select switch 15.

The source follower drive circuit 13 supplies (controls) a current for driving the source follower 14.

In this example, the source follower drive circuit 13 is an example of a switching element, such as a MOSFET, disposed between the source terminal of the source follower 14 and a ground line through which a ground (GND) voltage is supplied to the source follower drive circuit 13. Alternatively, in some examples, the source follower drive circuit 13 may be a N-channel transistor.

The amount of current that flows through the source follower drive circuit 13 is controlled by the voltage Bias1 input to the gate terminal of the source follower drive circuit 13.

The control switch 17 is controlled by the control signal ACTV1 supplied from the controller 5. The control switch 17 is configured to control the current to be supplied to the source follower drive circuit 13.

The select switch 15 is an example of a "connection element". The select switch 15 is a switching element disposed between the source terminal of the source follower 14 and the amplifier 3.

In this example, the select switch 15 is disposed between the source terminal of the source follower 14 and the output line 2 connected to the amplifier 3, to switch between connection and disconnection of the source terminal of the source follower 14 and the output line 2. When the select switch 15 is turned on, the electrical signal SF2IN output from the source terminal is supplied to the output line 2.

In this example, the select switch 15 is a transistor such as a MOSFET. The controller 5 controls the select switch 15 to switch on and off by supplying a control signal SL to the gate of the select switch 15.

In the following, a description is given of the amplifier 3 according to at least one embodiment of the present disclosure.

Figure 4:
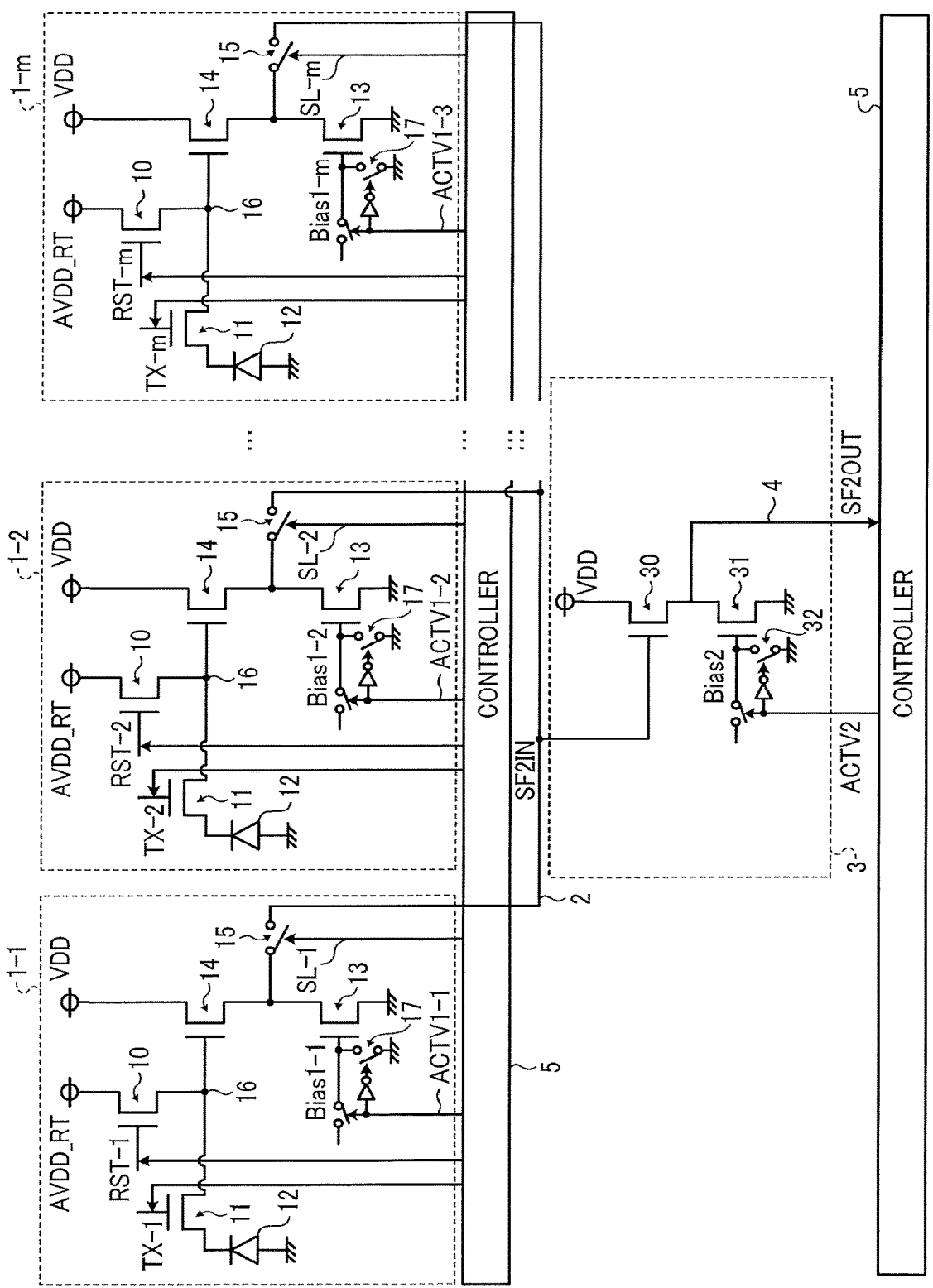
FIG. 4 is a circuit diagram of an amplifier according to at least one embodiment of the present disclosure.

FIG. 4 is a circuit diagram of the amplifier 3 according to an embodiment of the present disclosure, which is shared by a plurality of photoelectric convertors 1-1 to 1-$m$ (in this example, the number of photoelectric convertors 1 is m).

As illustrated in FIG. 4, the amplifier 3 includes an amplification element 30, an amplification element drive circuit 31, and a control switch 32.

The amplification element 30 outputs the electrical signal SF2OUT amplified according to the electrical signal SF2IN output from the pixel 18 included in the photoelectrical convertor 1.

The amplification element 30 is a transistor such as a MOSFET. The amplification element 30 has the gate, the source terminal, and the drain terminal connected with the output line 2, the output line 4, and the source line, respectively. The drain terminal receives a source voltage VDD.

The amplification element 30 amplifies the electrical signal SF21IN output through the output line 2 and outputs the electrical signal SF2OUT through the source terminal.

In this example, the amplification element drive circuit 31 is a switching element, such as a MOSFET, disposed between the output terminal (the source terminal in this example) of the amplification element 30 and a ground line through which a ground (GND) voltage is supplied to the amplification element drive circuit 31.

The amount of current that flows through the amplification element drive circuit 31 is adjusted by the voltage Bias2 input to the gate terminal of the amplification element drive circuit 31.

The control switch 32 is controlled by a control signal ACTV2 supplied from the controller 5. The control switch 32 is configured to control the current to be supplied to the amplification element drive circuit 31.

In at least one embodiment of the present disclosure, the controller 5 sequentially controls a plurality of pixels 18 in a time staggered manner such that the time period from outputting a reset signal to outputting a signal overlap between the pixels 18. During the time period from outputting, to the amplifier 3, a reset signal that represents the electrical signal corresponding to a reset voltage to reset the first pixel to outputting, to the amplifier 3, a signal that represents the electrical signal corresponding to the amount (intensity) of light received by the photoelectric conversion element 12 of the first pixel, the controller 5 controls a second pixel different from the first pixel to output a reset signal or a signal of the second pixel to the amplifier 3.

More specifically, the controller 5 sequentially drives the photoelectric convertors 1 in a time staggered manner. The controller 5 turns off the transfer element 11 and turns on the reset element 10, the source follower drive circuit 13, and the select switch 15 when outputting the reset signal of the pixel 18 from the source terminal of the source follower 14 to the amplifier 3.

The controller 5 turns off the reset element 10 and turns on the transfer element 11, the source follower drive circuit 13, and the select switch 15 when outputting a signal of the pixel 18 of the photoelectric convertor 1 from the source terminal of the source follower 14 to the amplifier 3 after outputting the reset signal of the pixel 18 from the source terminal of the source follower 14 to the amplifier 3.

The controller 5 causes the time period in which the source follower drive circuit 13 of the first pixel is maintained on, to overlap with the timer period in which the source follower drive circuit 13 of the second pixel is maintained on. A detailed description of such a control is given below.

Figure 5:
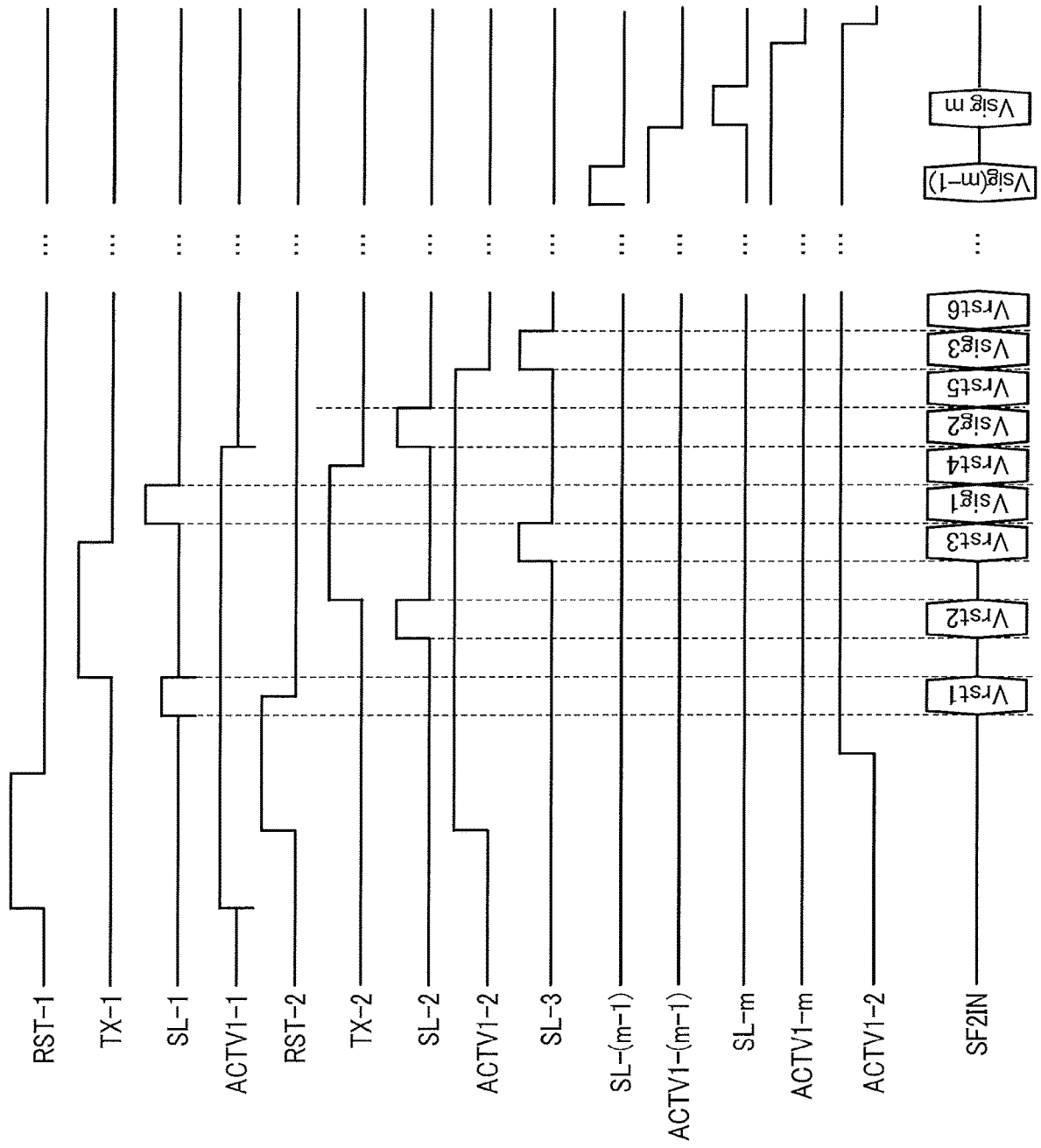
FIG. 5 is a timing chart of control signals controlled by a controller according to at least one embodiment of the present disclosure.

FIG. 5 is a timing chart of control signals controlled by the controller 5 according to at least one embodiment of the present disclosure.

In the following description, the control signal RST-x (x=1 to m) denotes a control signal to be supplied to the gate of the reset element 10 of the photoelectric convertor 1-$x$ of a plurality of photoelectric convertors 1 (the number of photoelectric convertors is m in this example) that shares the same amplifier 3. In this case, the photoelectric convertor 1-$x$ is the x-th photoelectric convertor to be driven by the controller 5.

Note that such a control signal is referred to simply as a control signal RST when the drive order does not matter. The same applies to the other control signals.

Similarly, the control signal TX-x (x=1 to m) represents a control signal to be supplied to the gate of the transfer element 11 of the photoelectric convertor 1-$x$ that is the x-th photoelectric convertor to be driven by the controller 5.

Similarly, the control signal SL-x (x=1 to m) represents a control signal to be supplied to the gate of the select switch 15 of the photoelectric convertor 1-$x$ that is the x-th photoelectric convertor to be driven by the controller 5.

Similarly, the control signal ACTV1 represents a control signal to be supplied to the gate of the control switch 17 of the photoelectric convertor 1-$x$ that is the x-th photoelectric convertor to be driven by the controller 5.

In reading an electrical signal output from each pixel 18, the CDS method is used that outputs a signal Vsig based on the level (voltage level) of the reset signal Vrst.

In such a CDS method, the level of the reset signal Vrst is determined before the signal Vsig. Accordingly, the controller 5 first outputs the resent signal Vrst, and subsequently outputs the signal Vsig after the elapse of the transfer time period of the electrical signal output from the photoelectric conversion element 12. The controller 5 controls transfer of the electrical signal from the photoelectric conversion element 12 with the control signal TX.

In the following description, among m photoelectric convertors 1 that share the amplifier 3, the photoelectric convertor 1-$x$ (x=1 to m) is the x-th photoelectric convertor to be driven by the controller 5. A reset signal and a signal output from the photoelectric convertor 1-*x* are referred to as a reset signal Vrstx and a signal Vsigx, respectively.

Note that such reset signal and signal are referred to simply as a reset signal Vrst and a signal Vsig, respectively when the drive order does not matter.

In the present embodiment, each of them photoelectric convertors 1-1 to 1-*m*, which are connected to the same amplifier 3, outputs the reset signal Vrst or the signal Vsig at a different timing.

In the following, a description is given of an operation example in which the controller 5 sequentially drives the photoelectric convertors 1-1, 1-2, and 1-3 of the m photoelectric convertors 1-1 to 1-*m* connected to the same amplifier 3.

As illustrated in FIG. 5, the controller 5 changes the control signal RST-1 and the control signal ACTV 1-1 from low to high.

Subsequently, the controller 5 maintains the control signal RST-1 at high for a predetermined period and changes the control signal RST-1 back to low.

After that, the controller 5 changes the control signal SL-1 from low to high. The controller 5 maintains the control signal SL-1 at high for a given time period, and changes the control signal SL-1 back to low.

During the time period in which the control signal SL-1 is maintained at high, the controller 5 passes the reset signal Vrst1 representing the electrical signal of the fixed voltage AVDD_RT to the output line 2. Further, the controller 5 changes the control signal TX-1 from low to high at the timing at which the control signal SL-1 becomes low.

As a result, the source follower 14 of the photoelectric convertor 1-1 receives, through the gate, the electrical signal corresponding to the intensity of light received by the photoelectric conversion element 12 of the photoelectric convertor 1-1. The controller 5 maintains the control signal TX-1 for a prescribed time period, and changes the control signal TX-1 back to low.

The controller 5 changes the control signal ACTV1-1 to high before changing the control signal SL-1 to high. This allows the source follower drive circuit 13 to stably operate when the reset signal Vrst1 is output to the output line 2.

In other words, in the present embodiment, the controller 5 turns on the source follower drive circuit 13 of the photoelectric convertor 1 before turning on the select switch (connection element).

Further, the controller 5 changes a control signal ACTV1-2 from low to high at the timing that overlaps a certain time period in which the control signal ACTV1-1 remains at high.

Such a configuration enables the photoelectric convertor 1-2 to output the reset signal Vrst2 during the time period from when the photoelectric convertor 1-1 outputs the reset signal Vrst1 to when the photoelectric convertor 1-1 becomes ready to output the signal Vsig1.

The controller 5 changes the control signal RST-2 to high before changing the control signal RSI-1 to low.

In the example of FIG. 5, the controller 5 changes the control signal RST-2 to high at the timing of changing the control signal ACTV1-2 to high.

The controller 5 maintains the control signal RST-2 for the predetermined time period and changes the control signal RST-2 back to low.

After that, the controller 5 changes the control signal SL-2 from low to high. The controller 5 maintains the control signal SL-2 at high for the given time period, and changes the control signal SL-2 back to low.

During the time period in which the control signal SL-2 is maintained at high, the controller 5 supplies the reset signal Vrst2 representing the electrical signal of the fixed voltage AVDD_RT to the output line 2.

Further, the controller 5 changes the control signal TX-2 from low to high at the timing at which the control signal SL-2 changes to low.

As a result, the source follower 14 of the photoelectric convertor 1-2 receives, through the gate, the electrical signal corresponding to the intensity of light received by the photoelectric conversion element 12 of the photoelectric convertor 1-2.

The controller 5 maintains the control signal TX-2 for the prescribed time period, and changes the control signal TX-2 back to low.

In a similar manner as the above, the controller 5 changes a control signal ACTV1-3 from low to high at the timing that overlaps the certain time period in which the control signal ACTV1-2 remains at high.

Before changing the control signal RST-2 to low, the controller 5 changes a control signal RST-3 to high at the timing at which the control signal ACTV1-3 changes to high.

The controller 5 maintains the control signal RST-3 for the predetermined time period and changes the control signal RST-3 back to low.

After that, the controller 5 changes the control signal SL-3 from low to high. The controller 5 maintains the control signal SL-3 at high for the given time period, and changes the control signal SL-3 back to low.

During the time period in which the control signal SL-3 is maintained at high, the controller 5 supplies the reset signal Vrst3 representing the electrical signal of the fixed voltage AVDD_RT to the output line 2.

When the controller 5 maintains the control signal TX-2 at high after changing the control signals TX-1 and SL-3, the controller 5 changes the control signal SL-1 to high.

During the time period in which the control signal SL-1 is maintained at high, the controller 5 supplies the signal Vsig1 representing the electrical signal that corresponds to the intensity of light received by the photoelectric conversion element 12 of the photoelectric convertor 1-1, to the output line 2.

Thereafter, the same operation is repeated. As a result, the controller 5 controls the photoelectric convertors 1-1 to 1-*m* such that a pixel 18 of a photoelectric convertor 1-*i* (i is natural number) outputs a reset signal Vrsti, and subsequently a pixel 18 of a photoelectric convertor 1-*p* (p is natural number) different from the photoelectric convertor 1-*i* outputs a signal Vsign. Subsequently, a photoelectric convertor 1-(*i*+1) outputs a reset signal Vrst(i+1), and a pixel 18 of a photoelectric convertor 1-(*p*+1) outputs a signal Vsig(p+1) to the output line 2. The "i" and "n" are incremented one by one until each of "i" and "p" reaches m. In this case, the output signals do not overlap with each other. In other words, the controller 5 controls the photoelectric convertors 1 to alternate between an output of the reset signal Vrst and an output of the signal Vsig to the output line 2.

With such an operation configuration, a certain pixel 18 can output the reset signal Vrst or the signal Vsig during the time period from when another pixel 18 outputs the reset signal Vrst to when said another outputs the signal Vsig. This increases the efficiency of reading signals at the amplifier 3. This further eliminates wasted time for the amplifier 3 to wait until a signal is output from the pixel 18, which enables a reduction in power consumption.

Further, the controller 5 changes the control signal ACTV1, which is to be supplied to the gate of the source follower drive circuit 13 of the photoelectric convertor 1, from high to low at each time after outputting the signal Vsig of the photoelectric convertor 1. This configuration reduces the consumption current.

When compared with a configuration according to a comparative example in which each of the plurality of pixels 18 corresponding to one amplifier 3 is exclusively driven, the consumption current per unit time of the photoelectric conversion area 100 increases in the present embodiment of the present disclosure. However, there is no difference in the total consumption current over the whole time to read the electrical signal of the pixel 18 between the present embodiment and the comparative example.

Further, the time period in which the control signal ACTV2, which is to be supplied to the control switch 32 of the amplifier 3, is maintained at high can be advantageously reduced due to the reduction in the whole time to read the electrical signal of the pixel 18.

With such a configuration that enables a reduction in time to operate the later-stage device such as the amplifier 3, power consumption (consumption current) can be reduced as a whole.

In the present embodiment, the controller 5 turns on the amplification element drive circuit 31 of the amplifier 3 (changes the control signal ACTV2 from low to high) before outputting the reset signal Vrst from the first pixel 18 (of the first photoelectric convertor 1-1) to be driven (before turning on the select switch 15 corresponding to the first pixel 18), out of the plurality of pixels 18 that shares the same amplifier 3.

This configuration enables a stable operation of the amplification element drive circuit 31.

As described above, minimizing the time period of maintaining the control signal ACTV2 at high can reduce the consumption current.

Figure 6:
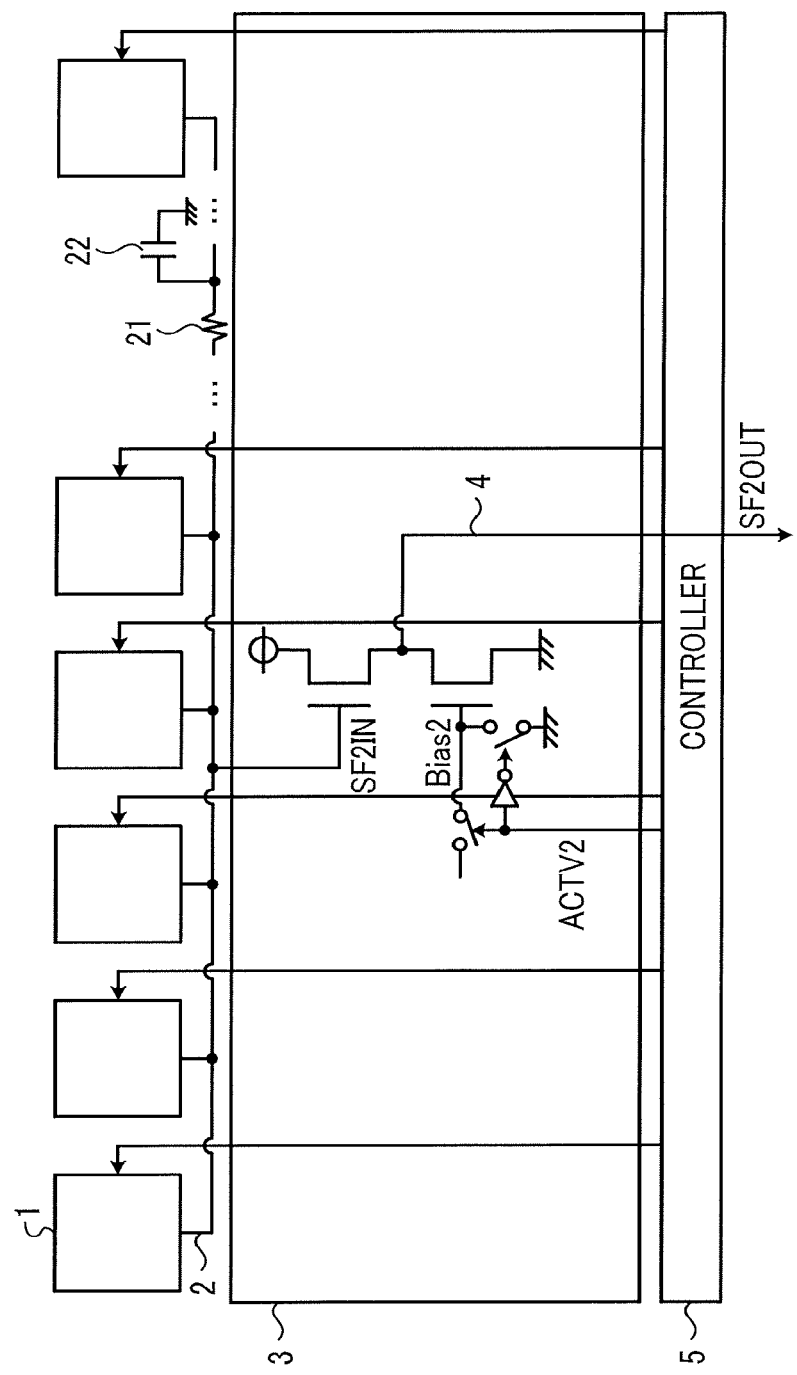
FIG. 6 is an illustration of the number of photoelectric convertors that share the amplifier and the load of an output line.

Next, a description is given of the number of photoelectric convertors 1 that share the same amplifier 3 and the load of the output line 4, referring to FIG. 6. FIG. 6 is an illustration of the number of photoelectric convertors 1 that share the amplifier and the load of an output line.

As the number of photoelectric convertors 1 that share the amplifier 3 increases, the number of amplifiers 3 can be reduced, which leads to a reduction in chip size.

However, the configuration in which a plurality of photoelectric convertors 1 shares one amplifier 3 disadvantageously increases the length of the output line 2 that connects between the amplifier 3 and each photoelectric convertor 1.

As illustrated in FIG. 6, the output line 2 (wire) has a parasitic resistance 21 and a parasitic capacitance 22. Accordingly, as the output line 2 increases in length, the parasitic resistance 21 and the parasitic capacitance 22 of the output line 2 increase.

The source follower 14 typically has a small size. Accordingly, as the parasitic resistance 21 and the parasitic capacitance 22 of the output line 2 increase, the source follower fails to respond to the requested reading speed.

To avoid such circumstances, in the present embodiment, one amplifier 3 is provided for a pixel group (a set of a predetermined number of pixels 18).

Figure 7:
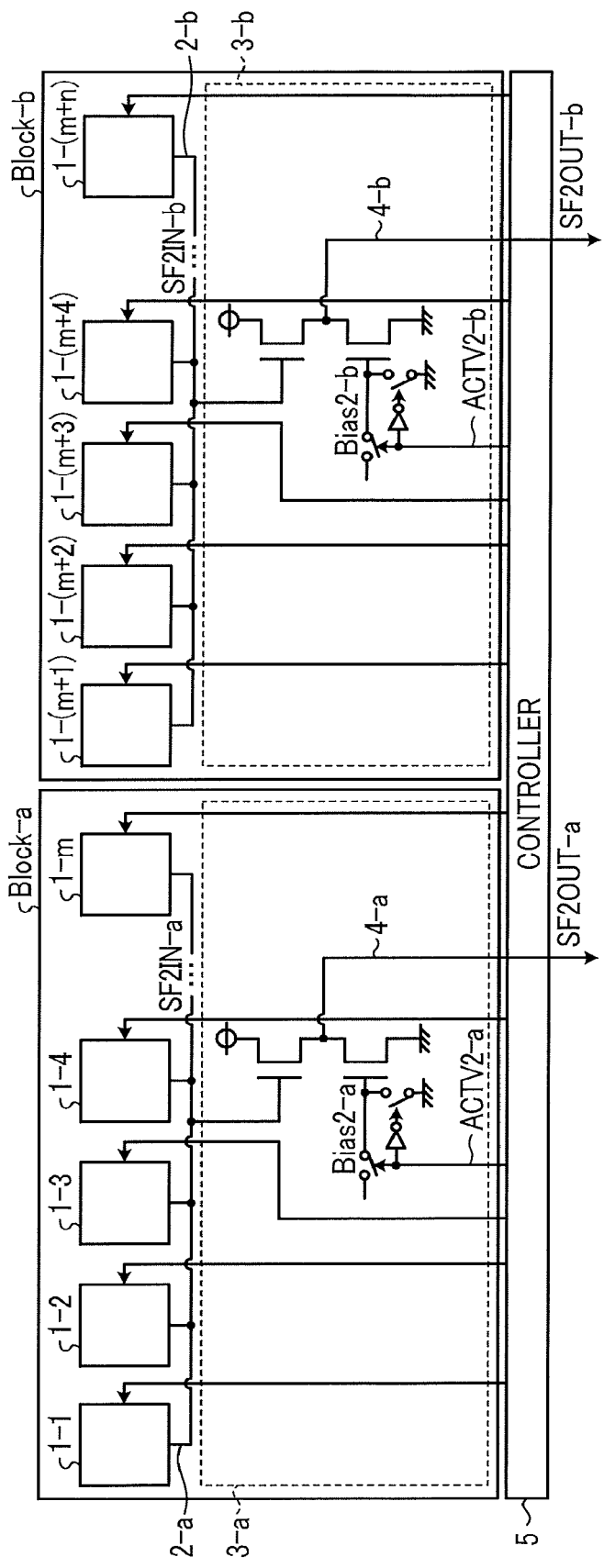
FIG. 7 is an illustration of a block that includes the photoelectric convertors and an amplifier shared by the photoelectric convertors.

FIG. 7 is an illustration of a block-a and a block-b each including one amplifier 3 and a pixel group of a plurality of pixels 18 that shares the amplifier 3. A plurality of pixel groups corresponds to a plurality of amplifiers 3, respectively. That is, one block includes one amplifier 3 and a plurality of photoelectric convertors 1 that shares the amplifier 3. The photoelectric convertors 1 correspond to a plurality of pixels 18, respectively.

Note that, the number of amplifiers 3 may not be the same as that of the output circuits 6 disposed to follow the amplifier 3. The numbers of the amplifier 3 and the output circuits 6 are variable according to, for example, design conditions.

The "block" is the unit for grouping the amplifiers 3 into pixel groups.

In FIG. 7, the block-a includes one amplifier 3-$a$ and m photoelectric convertors 1-1 to 1-$m$ that share the one amplification stage 3-$a$.

In the block-a, the amplifier 3-$a$ is connected with the m photoelectric convertors 1-1 to 1-$m$ via an output line 2-$a$. Further, the amplifier 3-$a$ outputs a signal through an output power line 4-$a$.

The block-b of FIG. 7 includes one amplifier 3-$b$ and n photoelectric convertors 1-$(m+1)$ to 1-$(m+n)$ sharing the one amplification stage 3-$b$.

The "n" may be the same as or different from "m".

In the block-b, the amplifier 3-$b$ is connected with the n photoelectric convertors 1-$(m+1)$ to 1-$(m+n)$ via an output line 2-$b$. Further, the amplifier 3-$b$ outputs a signal through an output power line 4-$b$.

In each block, the output line 2 has a different node, which can reduce the load on the output line 2 in each block (the parasitic resistance 21 and the parasitic capacitance 22 can be reduced).

Figure 8:
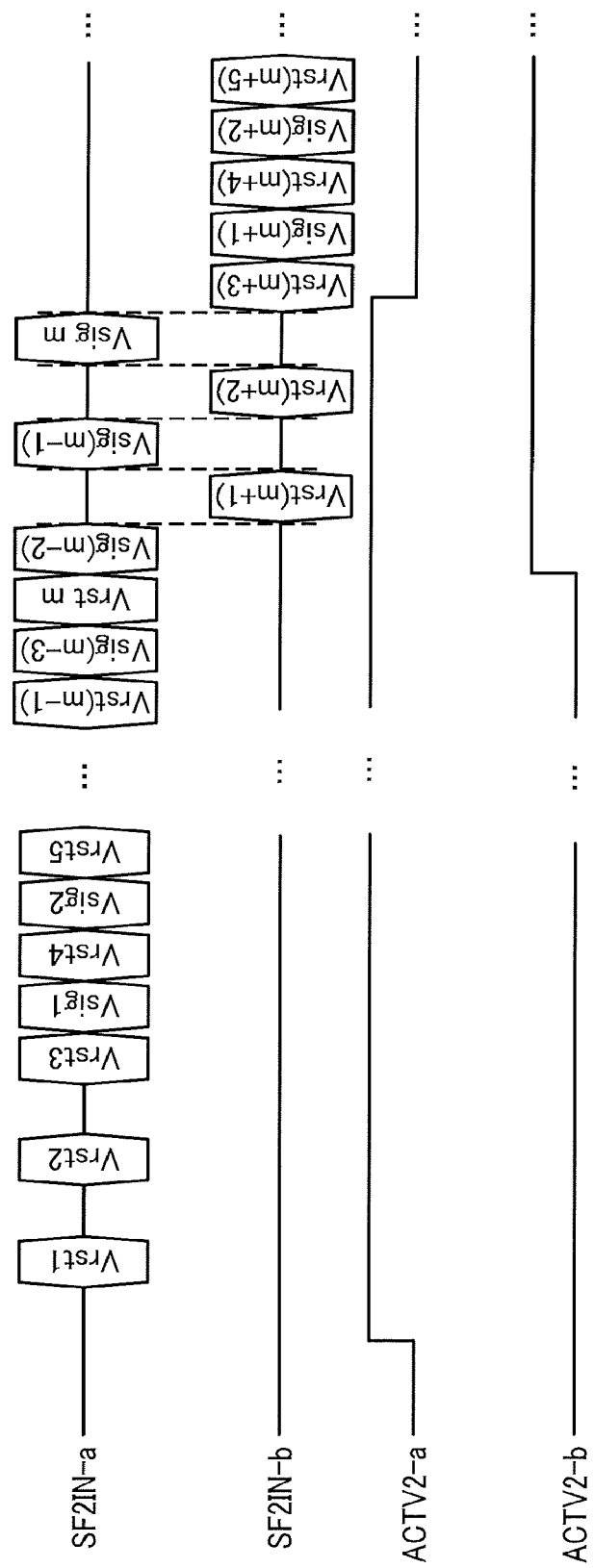
FIG. 8 is a timing chart of control signals controlled by the controller according to at least one embodiment of the present disclosure.

FIG. 8 is a timing chart of control signals in a case at which the controller 5 reads an electrical signal output from the block-a before reading a signal (another electrical signal) output from the block-b in the configuration of FIG. 7.

The controller 5 controls the operation of each photoelectrical convertor 1 to alternately output the reset signal Vrst and the signal Vsig as an electrical signal SF2IN-a to the output line 2-$a$ in the same manner as in the description of FIG. 5.

This control method is also as described with reference to FIG. 5.

In the same manner as in the block-a, the controller 5 controls the operation of each photoelectrical convertor 1 to alternately output the reset signal Vrst and the signal Vsig as an electrical signal SF2IN-b to the output line 2-$b$ in the same manner as in the description of FIG. 5.

This control method is also as described with reference to FIG. 5.

As illustrated in FIG. 8, the photoelectric convertor 1-1 of the block-a first outputs a reset signal Vrst1 to the output line 2-$a$.

The controller 5 changes the control signal ACTV2-a to high before outputting the reset signal Vrst1 to the output line 2-$a$ (before turning on the select switch 15 of the photoelectric convertor 1-1).

That is, the controller 5 turns on the amplification element drive circuit 31 of the amplifier 3 before outputting the reset signal Vrst of the first pixel 18 of the photoelectric convertor 1-1 first driven by the controller 5, out of the plurality of pixels 18 that shares the amplifier 3.

This configuration enables a stable operation of the amplification element drive circuit 31 at the time of reading the reset signal Vrst1.

Subsequently, the controller 5 controls the following photoelectric convertors 1-2 to 1-$m$ to sequentially output reset signals Vrst2 to Vrstm. In the middle of outputting the signals, the controller 5 controls the photoelectric convertors 1 to alternately output the reset signal Vrst and the signal Vsig.

The controller 5 changes the control signal ACTV2-*b* to high before outputting a reset signal Vrst following the reset signal Vrstm of the final photoelectric convertor 1-*m* of the block-a.

That is, the controller 5 turns on the amplification element drive circuit 31 of the block-b before the process of reading all the electrical signals output from the block-a is completed.

As a result, the controller 5 outputs a reset signal Vrst (*m*+1) of the first photoelectric convertor 1-(*m*+1) of the block-b at the timing of outputting a reset signal Vrst following the reset signal Vrstm of the final photoelectric convertor 1-*m* of the block-a.

In such a configuration, the controller 5 outputs the control signals ACTV2-*a* in a time staggered manner (changes the control signal ACTV2-*a* to high during the time period in which the ACTV2-*a* is maintained at high as illustrated in FIG. 8). This enables the reset signal Vrst and the signal Vsig to be alternately output in a continuous manner even with a switch from one block to another block to be driven by the controller 5. As a result, an efficient reading operation is achieved and the consumption current for each block is reduced.

That is, the image capturing device 1000 according to the present embodiment includes a plurality of pixel groups (blocks) each including a plurality of pixels 18 and an amplifier 3 shared by the plurality of pixels 18.

The controller 5 sequentially controls the photoelectric convertors 1 (the plurality of blocks) in a time staggered manner. That is, during the time period from when a first photoelectric convertor in a certain block outputs the reset signal Vrst of a first pixel to when the first photoelectric convertor outputs the signal Vsig of the first pixel to the amplifier 3 corresponding to the first photoelectric convertor, a second photoelectric convertor in the same block outputs the reset signal Vrst or the signal Vsig of a second pixel to the amplifier 3.

Further, the controller 5 controls the amplification element drive circuit 31 such that the time periods, in which the amplification element drive circuit 31 is maintained on, overlaps with each other between sequentially driven blocks.

With such configurations according to the present embodiment, the efficiency of reading signals at the amplifier 3 improves. Further, the wasted time for the amplifier 3 to wait until the signal comes from the pixel 18 is reduced or eliminated, thus reducing the power consumption.

The present disclosure is not limited to the details of the exemplary embodiments described above, and various variations and improvements are possible.

Further, various embodiments are implemented by appropriately combining a plurality of constituent elements disclosed in the above embodiment.

For example, some constituent elements may be deleted from all the constituent elements described in the above-described embodiment.

Hereinafter, variations are described. Each of the variations can be combined with the above-described embodiment, and the variations may be appropriately combined.

First Variation

Figure 9:
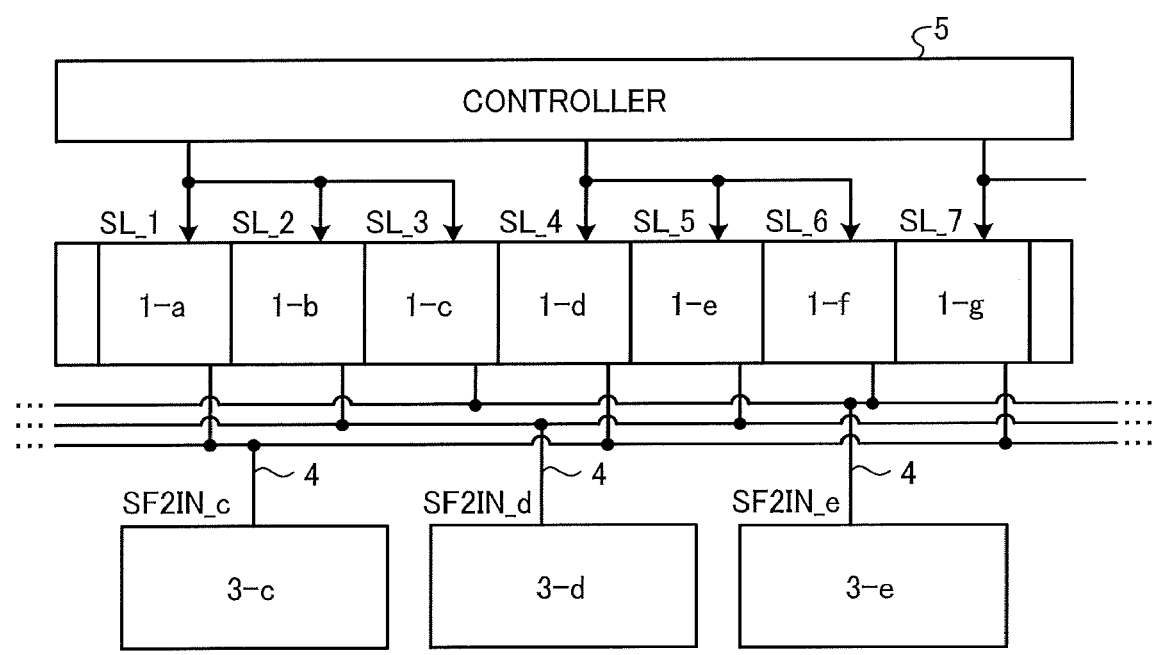
FIG. 9 is an illustration of a circuit configuration of an image sensor according to a variation of an embodiment of the present disclosure.

FIG. 9 is an illustration of a circuit configuration of an image sensor IM according to a first variation of an embodiment of the present disclosure. In FIG. 9, a plurality of pixels 18 (photoelectric convertors 1) output the reset signals Vrst or the signal signals Vsig at the same timing. Such pixels 18 are connected to different amplifiers 3 and arranged next to each other in a straight line.

More specifically, the photoelectric convertors 1-*a*, 1-*d*, and 1-*g* are connected to the amplifier 3-*c*. The photoelectric convertors 1-*b* and 1-*e* are connected to the amplifier 3-*d*. The photoelectric convertors 1-*c* and 1-*f* are connected to an amplifier 3-*e*.

With such a configuration, the photoelectric convertors 1-*a* to 1-*c*, which are next to each other, can read signals at the same time. The photoelectric convertors 1-*a* to 1-*c* are referred to as a "first pixel group".

Such a configuration further enables the photoelectric convertors 1-*d* to 1-*f* to read signals at the same time. The photoelectric convertors 1-*d* to 1-*f* are referred to as a "second pixel group".

As a result, parallel processing is achieved, thus enabling a high-speed read operation. In the example of FIG. 9, pixels to read signals at the same time are arranged next to each other, which enables the reading order to conform with the pixel arrangement sequence.

Thus, the difference between adjacent pixels due to different readout timings can be reduced.

Second Variation

In the configuration in which a plurality of pixels 18 is arranged in a matrix, for example, a controller 5 may control the pixels 18 (the photoelectric convertors 1) in the same row to output the reset signals Vrst or the signals Vsig at the same timing.

Figure 10:
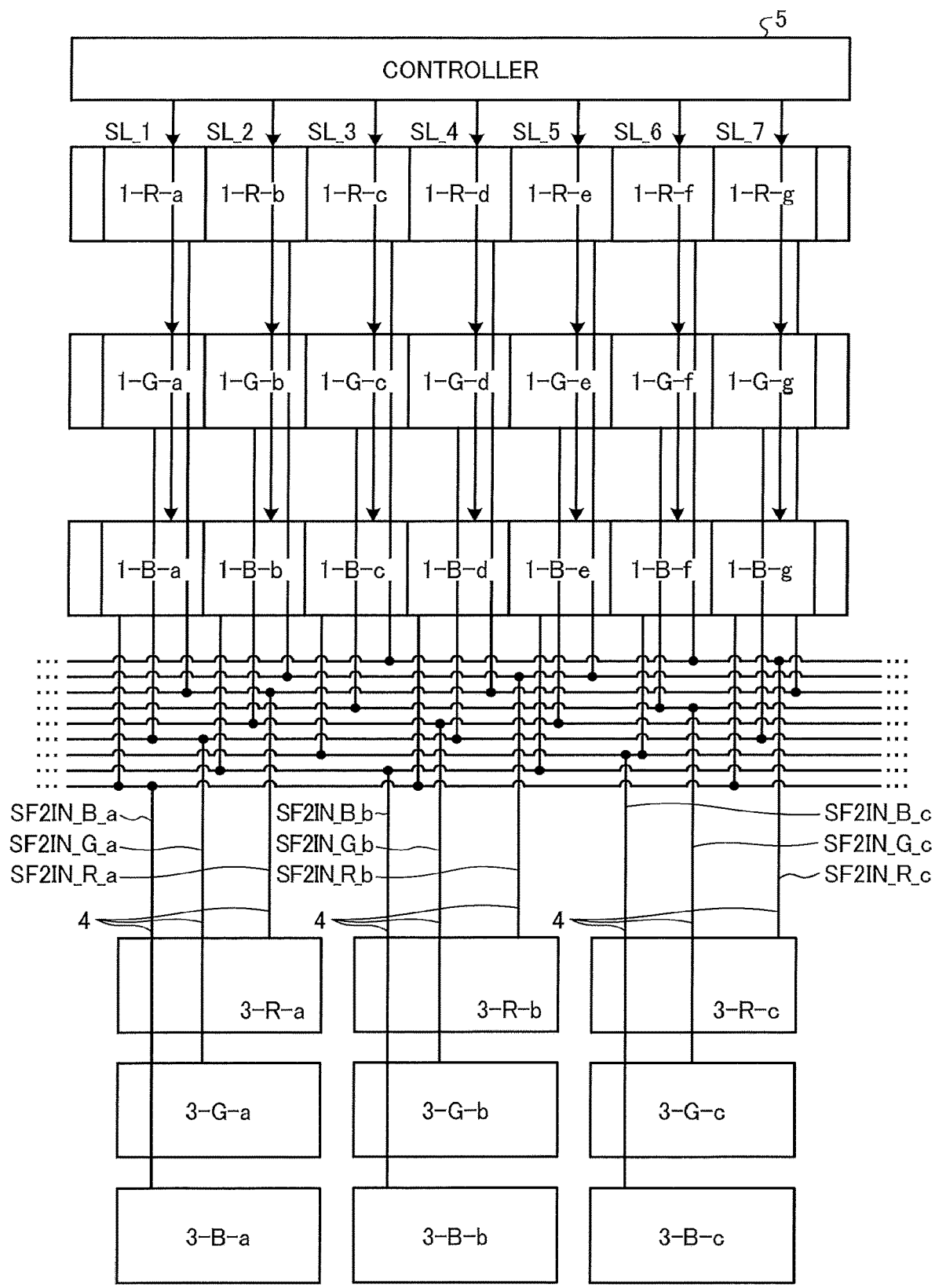
FIG. 10 is an illustration of a circuit configuration of an image sensor according to a second variation of an embodiment of the present disclosure.

FIG. 10 is an illustration of a circuit configuration of an image sensor IM according to a second variation of an embodiment of the present disclosure. In FIG. 10 for example, photoelectric convertors 1-R-a, 1-R-d, and 1-R-g in the same row are connected to different amplifiers 3 and operated by the common control signal, for example, S1-1. The same applies to the photoelectric convertors in the other rows.

In the example of FIG. 10, the photoelectric convertors 1-R-a, 1-R-d, and 1-R-g constitute a block connected to the common amplifier 3-R-a. The photoelectric convertors 1-R-b and 1-R-e constitute another block connected to the common amplifier 3-R-b. The photoelectric convertors 1-R-c and 1-R-f constitute still another block connected to the common amplifier 3-R-c.

Similarly, the photoelectric convertors 1-G-a, 1-G-d, and 1-G-g constitute a block connected to the common amplifier 3-G-a. The photoelectric convertors 1-G-b and 1-G-e constitute another block connected to the common amplifier 3-G-b. The photoelectric convertors 1-G-c and 1-G-f constitute still another block connected to the common amplifier 3-G-c.

Similarly, the photoelectric convertors 1-B-a, 1-B-d, and 1-B-g constitute a block connected to the common amplifier 3-B-a. The photoelectric convertors 1-B-b and 1-Be constitute another block connected to the common amplifier 3-B-b. The photoelectric convertors 1-B-c and 1-B-f constitute still another block connected to the common amplifier 3-B-c. The method of driving each block is the same as in the above embodiments.

In line sensors, for example, pixels of the three colors RGB are arranged in the row direction.

Data of pixels of three colors in the same row becomes a point data.

Accordingly, the pixels (electrical signals) of the three colors RGB in the same row are preferably read out at the same position of a document.

However, in the case of the rolling shutter method, the position of the document is more likely to change.

In view of the above, an amplifier 3 is provided for each color, and the pixels (electrical signals of the pixels) are read out in the row direction at the same timing by controlling the control signal such as the control signal SL by the controller 5. For example, the photoelectric convertors 1-R-a, 1-G-a, and 1-B-a arranged in the same row are controlled with the same control signal such as a control signal SL-1.

In addition, the photoelectric convertors 1-R-a, 1-G-a, and 1-B-a are connected to different amplifiers 3-R-a, 3-G-a, and 3-B-a, respectively, which enables readout of signals at the same timing.

Note that the number of colors is not limited to three, and the combination of the colors are also not limited to the RGB.

Third Variation

The controller 5 is capable of controlling the control signal ACTV1 more precisely.

For example, the controller 5 turns off the source follower drive circuit 13 of a photoelectric convertor 1 during the time period from when outputting a signal Vsig of a pixel 18 of the photoelectric convertor 1 from the source terminal of the source follower 14 to an amplifier 3, after outputting a reset signal Vrst of the pixel 18 from the source terminal of the source follower 14 to the amplifier 3.

Figure 11:
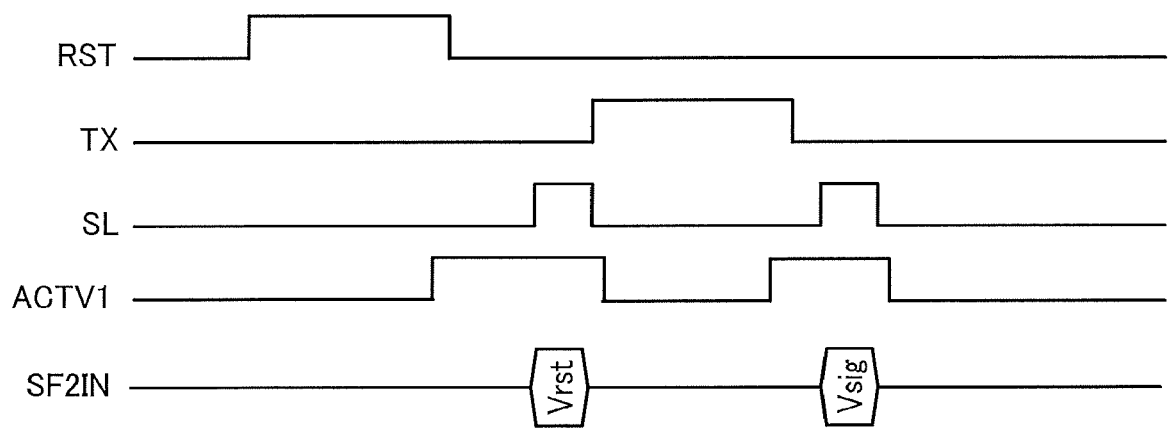
FIG. 11 is a timing chart of control signals controlled by a controller in an image sensor according to a third variation of an embodiment of the present disclosure.

FIG. 11 is a timing chart of control signals controlled by the controller 5 in an image sensor IM according to a third variation of an embodiment of the present disclosure.

In the above-described embodiment of FIG. 5, the controller 5 maintains the control signal ACTV1, which is output by the controller 5 to control the source follower drive circuit 13, at high, during the time period from the time when the pixel 18 of the photoelectric convertor 1 outputs the reset signal Vrst of the pixel 18 to the time when the same pixel 18 outputs the signal Vsig of the pixel 18. In contrast, in the example of FIG. 11, the controller 5 changes the control signal ACT1 to the lower level during such a time period.

This configuration enables a further reduction in consumption current.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), DSP (digital signal processor), FPGA (field programmable gate array) and conventional circuit components arranged to perform the recited functions.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An image capturing device comprising;
    a photoelectric converter including one of a plurality of pixels, each pixel including at least a photoelectric conversion element, each of the plurality of pixels configured to output an electrical signal corresponding to an intensity of light received by the photoelectric conversion element;
    an amplifier to amplify the electrical signal output by each of the plurality of pixels; and
    control circuitry to sequentially drive the plurality of pixels in a time staggered manner such that, during a time period from when a certain pixel outputs a reset signal to the amplifier to when the certain pixel outputs a signal to the amplifier, a subsequent pixel of the certain pixel outputs one of a reset signal and a signal to the amplifier,
    the reset signal representing an electrical signal of a reset voltage to reset a corresponding pixel, and
    the signal representing the electrical signal corresponding to intensity of light received by the photoelectric conversion element of the corresponding pixel.

2. The image capturing device according to claim 1, further comprising a plurality of photoelectric convertors each including a corresponding one of the plurality of pixels, wherein each of the plurality of pixels further includes:
    a transfer element to transfer an electrical signal output from the photoelectric conversion element;
    a capacitive element to hold the electrical signal transferred from the transfer element;
    a source follower to output, from a source terminal, an electrical signal corresponding to the electrical signal output from the capacitive element and received at a gate; and
    a reset element to set a voltage of the capacitive element to the reset voltage,
    wherein each of the plurality of photoelectric convertors includes:
    a drive circuit to supply a current to drive the source follower; and
    a connection element to switch between connection and disconnection of the source terminal of the source follower and the amplifier.

3. The image capturing device according to claim 2,
    wherein the transfer element is a switching element disposed between the photoelectric conversion element and the capacitive element,
    wherein the reset element is a switching element disposed between the capacitive element and an electrical line through which a fixed voltage of the reset voltage is supplied to the reset element,
    wherein the drive circuit is a switching element disposed between the source terminal of the source follower and a ground line through which a ground voltage is supplied to the drive circuit,
    wherein the connection element is a switching element disposed between the source terminal of the source follower and the amplifier, and
    wherein the control circuitry is configured to sequentially control the plurality of photoelectric convertors in the time staggered manner to:
    turn off the transfer element and turn on the reset element, the drive circuit, and the connection element when outputting the reset signal of a corresponding pixel from the source terminal of the source follower to the amplifier; and
    turn off the reset element and turn on the transfer element, the source follower, and the connection element when outputting the signal of the corresponding pixel from the source terminal of the source follower to the amplifier, after outputting the reset signal of the corresponding pixel from the source terminal of the source follower to the amplifier.

4. The image capturing device according to claim 3, wherein the control circuitry is configured to cause a time period, in which a drive circuit of the certain pixel is maintained on, to at least partly overlap a time period in which a drive circuit of the subsequent pixel of the certain pixel is maintained on.

5. The image capturing device according to claim 2, wherein the control circuitry is configured to turn on the drive circuit of the photoelectric convertor before turning on the connection element of the photoelectric convertor.

6. The image capturing device according to claim 2, wherein the control circuitry is configured to maintain the drive circuit off during a time period from when the certain pixel outputs the reset signal from the source terminal of the source follower to the amplifier to when the certain pixel outputs the signal from the source terminal of the source follower to the amplifier.

7. The image capturing device according to claim 1, wherein the control circuitry is configured to output one of the reset signal and the signal at a common timing from a plurality of pixels connected to different amplifiers and disposed next to each other in sequence.

8. The image capturing device according to claim 1, wherein the plurality of pixels is disposed in a matrix, and wherein the control circuitry is configured to output one of the reset signal and the signal from pixels in a common row at a common timing.

9. The image capturing device according to claim 1, wherein the amplifier further includes:
an amplification element to amplify the electrical signal output by each of the plurality of pixels and output the amplified electrical signal; and
an amplification element drive circuit disposed between an output terminal of the amplification element and a ground line through which a ground voltage is supplied to the amplification element drive circuit, the amplification element drive circuit configured to adjust a current to drive the amplification element.

10. The image capturing device according to claim 9, wherein, before a first pixel to be driven by the control circuitry outputs the reset signal, the control circuitry is configured to turn on the amplification element drive circuit of an amplification corresponding to the first pixel.

11. The image capturing device according to claim 9, wherein the amplifier includes a plurality of amplifiers each corresponding to a set of a plurality of pixels, and wherein the control circuitry is configured to, during a time period from when the given pixel outputs the reset signal to a corresponding one amplifier of the plurality of amplifiers to when the given pixel outputs the signal to the corresponding one amplifier, the subsequent pixel of the given pixel outputs one of the reset signal and the signal of the subsequent pixel to the corresponding one, in each set of the plurality of pixels, so as to cause a time period, in which the amplification element drive circuit of the corresponding one amplifier is maintained on, to overlap with each other between the plurality of pixels.

12. An image capturing method comprising:
outputting an electrical signal corresponding to an intensity of light received by a photoelectric conversion element included in each of a plurality of pixels;
driving a certain pixel of the plurality of pixels, which is to be sequentially driven in a time staggered manner, to output a reset signal representing an electrical signal corresponding to a reset voltage to reset the certain pixel to an amplifier; and
driving a subsequent pixel of the certain pixel to output one of a reset signal of the subsequent pixel and a signal representing an electrical signal corresponding to an intensity of light received by a photoelectric conversion element of the subsequent pixel before the certain pixel outputs a signal of the certain pixel, after the driving of the certain pixel to output the reset signal of the certain pixel.

* * * * *